United States Patent
Coullomb

(10) Patent No.: US 9,349,671 B2
(45) Date of Patent: May 24, 2016

(54) INTEGRATED CIRCUIT CHIP COMPRISING ELECTRONIC DEVICE AND ELECTRONIC SYSTEM

(71) Applicant: STMicroelectronics (Grenoble 2) SAS, Grenoble (FR)

(72) Inventor: Alexandre Coullomb, Izeaux (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/511,920

(22) Filed: Oct. 10, 2014

(65) Prior Publication Data

US 2015/0102499 A1   Apr. 16, 2015

(30) Foreign Application Priority Data

Oct. 15, 2013   (FR) ...................... 13 60007

(51) Int. Cl.
| H01L 23/473 | (2006.01) |
| H01L 23/48 | (2006.01) |
| H01L 23/367 | (2006.01) |
| H01L 23/498 | (2006.01) |
| H01L 25/10 | (2006.01) |
| H01L 25/18 | (2006.01) |

(52) U.S. Cl.
CPC .......... *H01L 23/473* (2013.01); *H01L 23/3677* (2013.01); *H01L 23/481* (2013.01); *H01L 23/49816* (2013.01); *H01L 23/49822* (2013.01); *H01L 25/105* (2013.01); *H01L 25/18* (2013.01); *H01L 2224/48091* (2013.01); *H01L 2224/48227* (2013.01); *H01L 2225/1023* (2013.01); *H01L 2225/1058* (2013.01); *H01L 2225/1094* (2013.01); *H01L 2924/15311* (2013.01)

(58) Field of Classification Search
None
See application file for complete search history.

(56) References Cited

U.S. PATENT DOCUMENTS

| 6,046,499 A | 4/2000 | Yano et al. |
| 6,477,034 B1 * | 11/2002 | Chakravorty ..... H01L 23/49822 257/E23.062 |
| 6,661,084 B1 * | 12/2003 | Peterson ............... B81B 7/0067 257/680 |
| 2002/0185718 A1 | 12/2002 | Mikubo et al. |
| 2008/0211079 A1 | 9/2008 | Onodera |

FOREIGN PATENT DOCUMENTS

| CN | 103178044 A | 6/2013 |
| EP | 0933813 A2 | 8/1999 |

OTHER PUBLICATIONS

INPI Search Report and Written Opinion for FR 1360007 dated Mar. 7, 2014 (10 pages).

* cited by examiner

*Primary Examiner* — Charles Garber
*Assistant Examiner* — Stanetta Isaac
(74) *Attorney, Agent, or Firm* — Gardere Wynne Sewell LLP

(57) ABSTRACT

An electronic device includes a substrate wafer made of many layers of an insulating material and including an electrical connection network. An integrated circuit chip is mounted to a top side of the substrate wafer. The substrate wafer further includes a metal plate that is integrated into the substrate wafer and thermally coupled to the integrated circuit chip. The metal plate may have a thickness in excess of several layers of the substrate wafer. The metal plate may include a duct through which a thermally conductive fluid flows.

14 Claims, 4 Drawing Sheets

INTEGRATED CIRCUIT CHIP COMPRISING ELECTRONIC DEVICE AND ELECTRONIC SYSTEM

PRIORITY CLAIM

This application claims priority from French Application for Patent No. 1360007 filed Oct. 15, 2013, the disclosure of which is incorporated by reference.

TECHNICAL FIELD

The present invention relates to the field of microelectronics.

BACKGROUND

It is known to make electronic systems that comprise electronic devices stacked one on top of the other and electrically connected together, including at least one integrated circuit chip respectively.

Stacking electronic devices in particular has the advantage of improving the performance of electrical connections and of reducing footprint. Nevertheless, in certain cases integrated circuit chips may produce heat and the heat produced may heat other integrated circuit chips and thus degrade the performance of the latter. This is especially the case when a first electronic device comprises a processor chip that produces heat, and a second electronic device stacked on the first comprises a memory chip, the operation of which in particular degrades when its temperature increases.

The above circumstances are an obstacle to increasing the performance of said electronic systems, such as in particular the speed at which they run programs. However, the situation that at the present time consists in making a compromise between the performance desired from said electronic systems and their footprint, is unsatisfactory, especially in the field of portable devices such as mobile phones.

SUMMARY

According to one embodiment, an electronic device is provided, which comprises a substrate wafer made of an insulating material, which wafer is equipped with an electrical connection network and which bears, on one side, at least one integrated circuit chip, and which device comprises at least one metal plate integrated into said substrate wafer.

A plurality of intermediate metal elements and a plurality of external metal elements may be placed on either side of the substrate wafer.

Said intermediate metal elements may comprise first intermediate metal elements connecting said chip and said electrical connection network, and second intermediate metal elements connecting said chip to said metal plate.

Said external metal elements may comprise first metal elements connected to said electrical connection network and second external metal elements connected to said metal plate.

Said metal plate may lie between intermediate metal levels of said electrical connection network.

Said metal plate may be connected to said second intermediate metal elements by metal vias.

Said metal plate may be connected to said second external metal elements by metal vias.

Said metal plate may comprise protrusions on which said second intermediate metal elements are placed.

Said metal plate may comprise protrusions on which said second external metal elements are placed.

Said metal plate may contain at least one internal duct filled with a thermally conductive material.

Said substrate wafer may contain ducts connected to said internal duct of said metal plate and connected to means for making a fluid flow.

An electronic system is also provided, which comprises said electronic device, and which comprises another electronic device placed on said electronic device and comprising another substrate wafer equipped with another electrical connection network connected to said electrical connection network and bearing at least one other integrated circuit chip connected to this other electrical connection network.

Said system may comprise a printed circuit board bearing said electronic device by way of external metal elements.

BRIEF DESCRIPTION OF THE DRAWINGS

Electronic devices and electronic systems, according to particular embodiments of the present invention, will now be described by way of nonlimiting example, these devices and systems being illustrated by the drawings, in which.

DETAILED DESCRIPTION OF THE DRAWINGS

Figure 1:
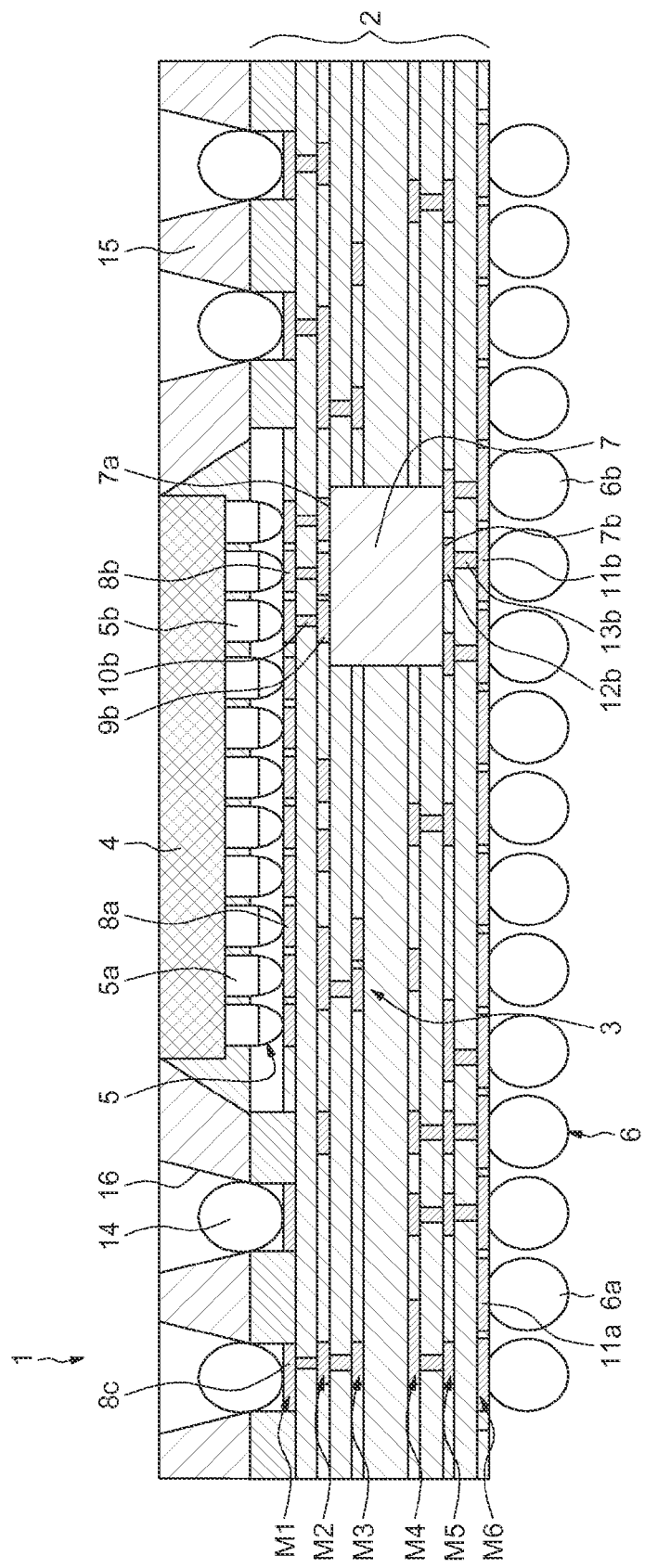
FIG. 1 shows a cross section of an electronic device.

As illustrated in FIG. 1, an electronic device 1 comprises a substrate wafer 2 equipped with an integrated metal electrical connection network 3 connecting one side to the other, an integrated circuit chip 4 placed on one side of the substrate wafer 2, a plurality of intermediate metal electrical connection elements 5 such as columns, and a plurality of external metal electrical connection elements 6, such as bumps, placed on either side of the substrate wafer 2.

In the example shown, the integrated electrical connection network 3 comprises, from the top of the substrate wafer, six separate metal levels M1, M2, M3, M4, M5 and M6 parallel to the sides of the substrate wafer 2, which levels respectively comprise metal pads selectively connected by interlevel metal electrical connection vias.

Furthermore, the electronic device 1 comprises at least one metal plate 7 integrated or incorporated into the substrate wafer 2 and separate from the metal electrical connection network 3.

In the example shown, the thickness of the metal plate 7 is such that it occupies the thickness comprised between the intermediate metal levels M2 and M5.

The plurality of intermediate metal elements 5 comprises first intermediate metal elements 5a connecting the chip 4 and the electrical connection network 3, and interposed between metal pads of the chip 4 and metal pads 8a of the metal level M1 of this electrical connection network 3.

The plurality of intermediate metal elements 5 also comprises second intermediate metal elements 5b interposed between the chip 4 and metal pads 8b of the metal level M1 of the electrical connection network 3.

In the metal level M2, metal pads 9b are arranged on the corresponding side 7a of the metal plate 7.

Metal vias 10b are arranged between metal pads 8b of the metal level M1, and metal pads 9b of the metal level M2.

The plurality of external metal elements 6 comprises first external metal elements 6a placed on metal pads 11a of the metal level M6 of the electrical connection network 3.

The plurality of external metal elements 6 also comprises second external metal elements 6b placed on metal pads 11b of the metal level M6 of the electrical connection network 3.

In the metal level M5, metal pads 12b are arranged on the corresponding side 7b of the metal plate 7.

Metal vias 13b are arranged between metal pads 11b of the metal level M6, and metal pads 12b.

According to one embodiment, the integrated circuit chip 4, which may be a processor chip, may generate heat. At least some of this heat may preferentially be transferred to the metal plate 7 integrated into the substrate wafer 2 by way of the second intermediate metal elements 5b, the metal pads 8b, the metal vias 10b and the metal pads 9b.

Thus, the integrated or incorporated metal plate 7, because of its relatively large volume, acts as a heat sink or a heat pump and forms a heat transfer means, in such a way that the chip 4 is cooled.

Thus, at least some of this heat may be transferred to the second external metal elements 6b.

The electrical connection elements 5b used to preferentially evacuate the heat may be chosen so that they are located in a localized zone of the chip 4 producing the most heat.

Some of the heat produced by the chip 4 may also be transferred to the electrical connection network 3 by way of the electrical connection elements 5a, then transferred to the electrical connection elements 6a.

Moreover, in the metal level M1, are arranged auxiliary metal pads 8c located on the periphery of the chip 4, and on which are placed auxiliary metal elements 14.

The electronic device 1 may furthermore comprise an encapsulating layer 15 provided on the substrate wafer 2 and around the chip 4, this layer 15 containing holes 16 in which auxiliary metal electrical connection elements 14, such as metal bumps, are placed.

Figure 2:
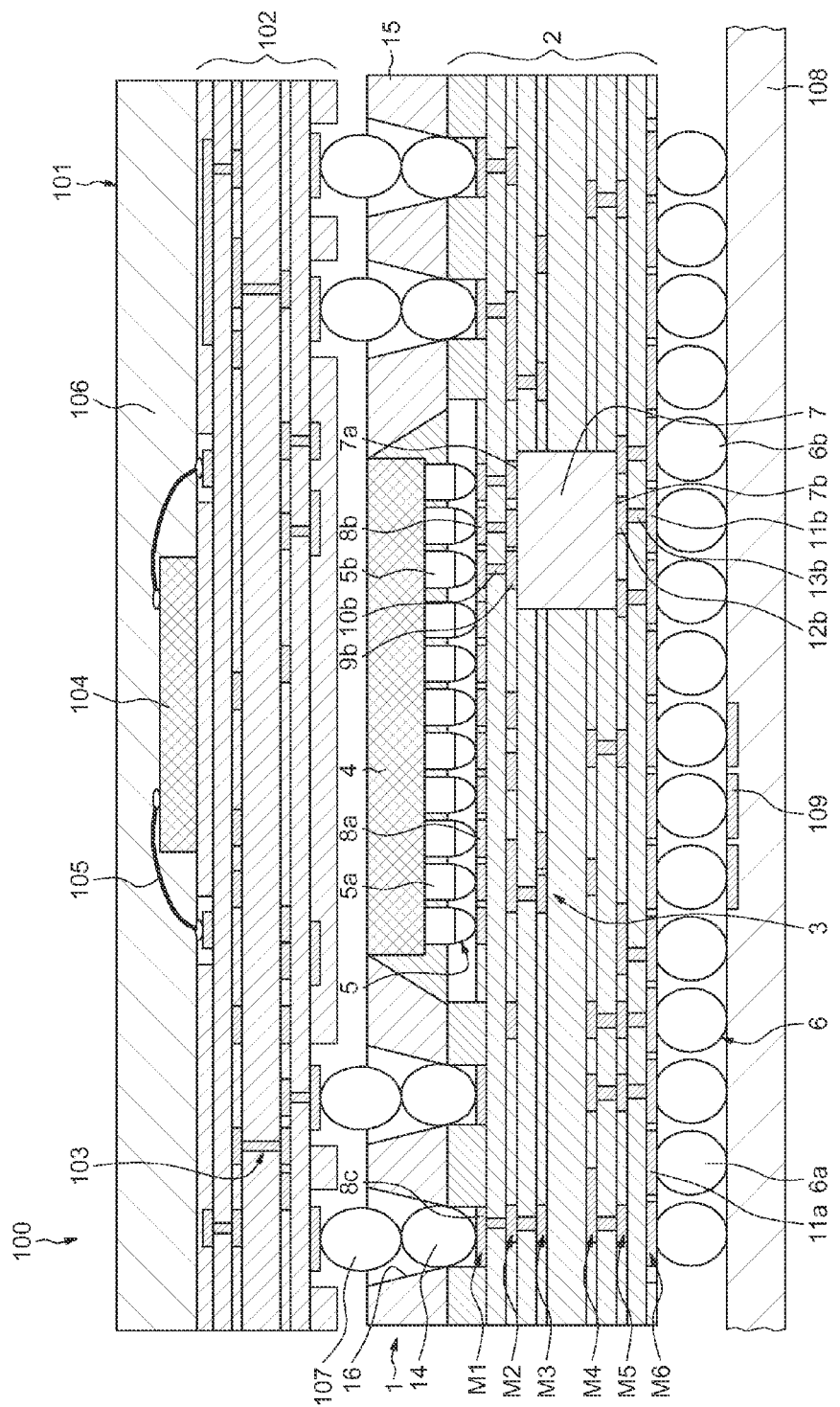
FIG. 2 shows a cross section of an electronic system including the electronic device in FIG. 1.

As illustrated in FIG. 2, an electronic system 100 may comprise the electronic device 1 in FIG. 1, and another electronic device 101 stacked on the electronic device 1 on the same side as the chip 4.

According to one example embodiment, the electronic device 101 comprises a substrate wafer 102 equipped with an electrical connection network 103 connecting one side to the other, and furthermore bears an integrated circuit chip 104 bonded to that side opposite the electronic device 1.

The chip 104 is connected to the electrical connection network 103 by metal wires 105.

The chip 104 and the electrical connection wires 105 are embedded in an encapsulation material 106 provided on the corresponding side of the substrate wafer 102.

The electronic device 101 is mounted on the electronic device 1 by way of electrical connection elements 107 such as metal bumps, which elements 107 are interposed between said devices, and electrically and selectively connect the electrical connection network 103 of the electronic device 101 to the electrical connection network 3 of the electronic device 1 by being soldered to electrical connection elements 14 placed on the pads 8c.

Furthermore, the electronic device 1, and therefore the electronic system 100, is mounted on a printed circuit board 108 by way of electrical connection elements 6 soldered to metal pads 109 of this board 108.

The arrangement described above by way of example has the following advantages.

The chip 104, which may be a memory chip, is set away from the chip 4 and is separated from the latter by the substrate wafer 102 and by the space separating the electronic device 1 and the electronic device 101.

The heat produced by the chip 4 and transferred to the connection elements 6a and, preferentially, to the electrical connection elements 6b as described above, diffuses into the printed circuit board 108.

The heat produced by the chip 4 also diffuses into the space separating the electronic device 1 and the electronic device 101, in order to be evacuated toward the exterior.

It follows from the foregoing description that the metal plate 7 forms a means for capturing at least some of the heat produced by the chip 4, and a means for transferring heat away from the chip 104.

Thus, diffusion of the heat produced by the chip 4 toward the chip 104 is limited in such a way that the chip 104 is protected from any excessive increase in its temperature.

Moreover, as the metal elements 5b connected to the chip 4 are connected to the metal elements 6b, in particular by way of the metal plate 7, this connection may be used for electrical purposes, for example in order to form a connection to electrical ground.

Figure 3:
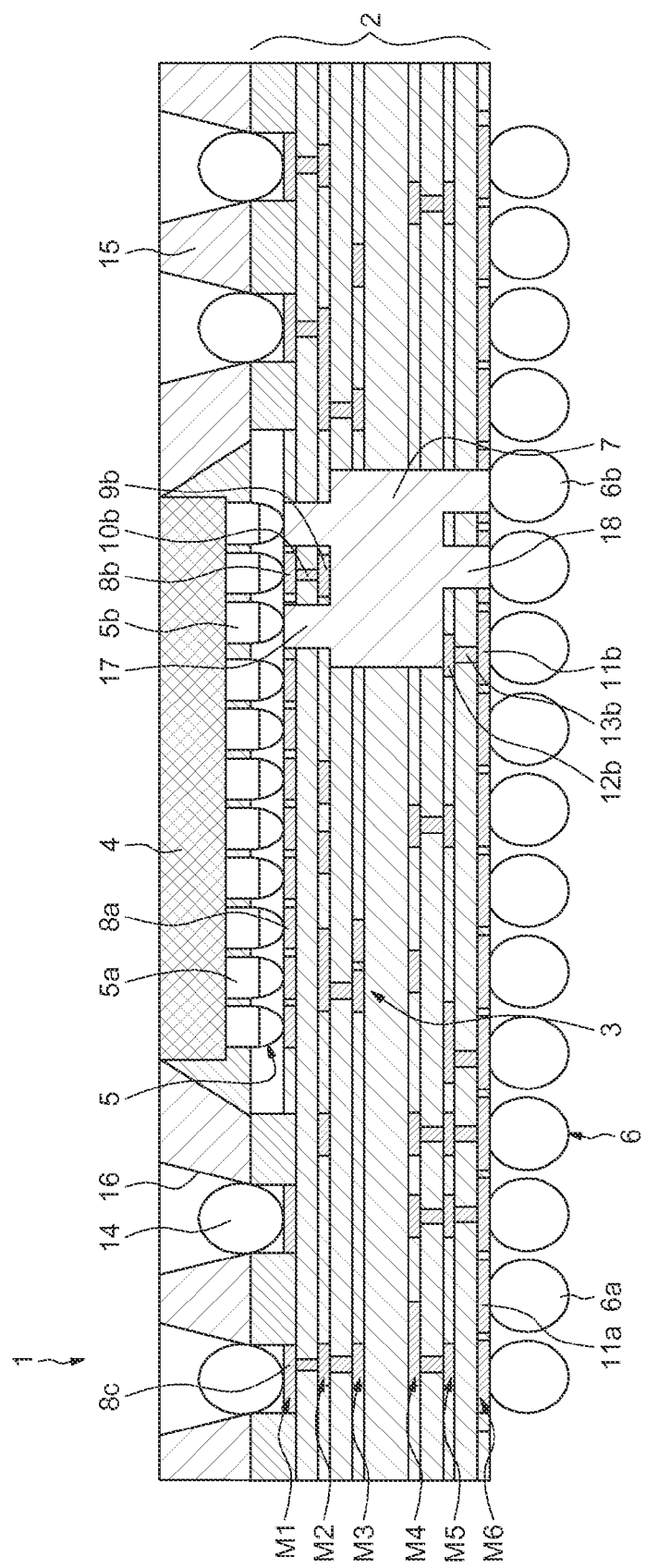
FIG. 3 shows a variant embodiment of the electronic device in FIG. 1.

According to one variant embodiment of the electronic device 1, which variant is illustrated in FIG. 3, the metal pads 8b of the metal level M1, the metal pads 9b of the metal level M2 and the metal vias 10b connecting them together may be replaced, at least in part, by protrusions 17 in the metal plate 7, protruding relative to its side 7a, the electrical connection elements 5b making contact with said protrusions 17.

Likewise, the metal pads 11b of the metal level M6, the metal pads 12b of the metal level M5 and the metal vias 13b connecting them together may be replaced, at least in part, by protrusions 18 in the metal plate 7, protruding relative to its side 7b, the electrical connection elements 6b making contact with said protrusions 18.

Figure 4:
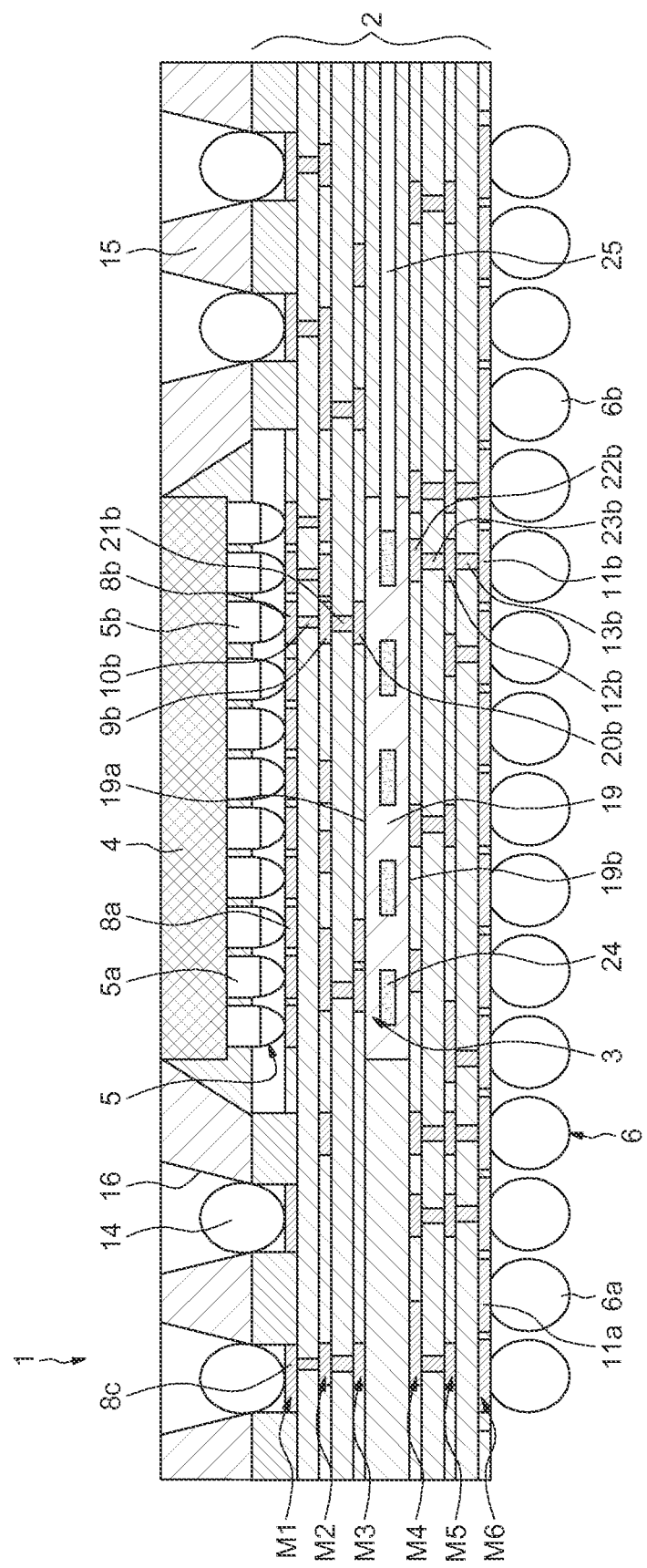
FIG. 4 shows another variant embodiment of the electronic device in FIG. 1.

According to one variant embodiment of the electronic device 1, which variant is illustrated in FIG. 4, the metal plate 7 is replaced by a metal plate 19 integrated between the intermediate metal levels M3 and M4 of the electrical connection network 3.

In the metal level M3, metal pads 20b are arranged on the side 19a of the metal plate 19, which pads 20b are connected to the metal pads 9b of the metal level M2 by metal vias 21b.

Likewise, in the metal level M4, metal pads 22b are arranged on the side 19b of the metal plate 19, which pads 22b are connected to the metal pads 12b of the metal level M5 by metal vias 21b.

According to one variant embodiment, the metal plate 19 may contain internal ducts 24 that may be filled with a thermally conductive or heat transfer fluid such as a polyalphaolefin or one of the FC electronic liquids sold under the name or trademark Fluorinert.

According to one variant embodiment, the internal ducts 24 may be connected to ducts 25, for example supply/return ducts, for example arranged in the layer of the substrate wafer 2 separating the metal levels M3 and M4, these ducts 25 emerging laterally from the substrate wafer 2 and possibly being connected to external means suitable for making a cooling fluid flow through the ducts 24.

According to another variant embodiment, the electronic device 1 may be equipped with a component incorporating a micropump, which component may be fixed to one of the sides of the device, for example by bonding, this micropump being connected to the internal ducts 25 by suitable passages, in order to make the heat transfer or cooling fluid flow through the internal ducts 24 of the metal plate.

Thus, evacuation of the heat produced by the chip 4 may be even further improved.

The metal plates 7 and 19 may extend over a zone corresponding approximately to a small zone of the chip 4 producing the heat, or over a larger zone corresponding approximately to the total zone of the chip, or over a zone protruding laterally relative to the chip 4.

The present invention is not limited to the examples described above. In particular, the structure of the device 101 could be different. The metal plate could lie between other metal levels. More than one metal plate could be provided. Other heat capturing, heat transfer and cooling means including a metal plate integrated into the substrate could be provided. Many other variant embodiments are possible without departing from the scope of the invention.

What is claimed is:

1. An electronic device, comprising:
   a substrate wafer made of an insulating material and including an electrical connection network extending between a first face and a second face, said electrical connection network having a plurality of metal levels connected by vias;
   at least one integrated circuit chip mounted on the first face of the substrate wafer;
   a plurality of intermediate metal elements configured to mount the integrated circuit chip to the substrate wafer;
   a plurality of external metal elements mounted on an opposite side of the substrate wafer;
   a metal plate integrated into said substrate wafer and lying between intermediate ones of said metal levels, wherein the metal plate comprises protrusions extending from the metal plate through the substrate wafer and thermally connected to the plurality of intermediate metal elements and the plurality of external metal elements.

2. The electronic device according to claim 1, wherein said intermediate metal elements comprise: first intermediate metal elements connecting said integrated circuit chip to said electrical connection network and second intermediate metal elements connecting said integrated circuit chip to the metal plate; and
   wherein said external metal elements comprise first metal elements connected to said electrical connection network and second external metal elements connected to said metal plate.

3. The device according to claim 2, wherein said second intermediate metal elements are placed on the protrusions of the metal plate.

4. The device according to claim 3, wherein said second external metal elements are placed on the protrusions of the metal plate.

5. The device according to claim 1, wherein said metal plate contains at least one internal duct filled with a thermally conductive material.

6. The device according to claim 5, wherein said substrate wafer contains ducts connected to said internal duct of the metal plate, said ducts configured for connection to an external means for making a fluid flow through the ducts and internal duct.

7. The device according to claim 1, wherein said substrate wafer comprises a multiplicity of layers and wherein said metal plate has a thickness which is thicker than a plurality of said layers.

8. The device according to claim 1, further comprising another substrate wafer having another electrical connection network that is connected to said electrical connection network and including at least one other integrated circuit chip connected to the another electrical connection network.

9. The device according to claim 8, further comprising a printed circuit board to which the substrate wafer is mounted using external metal elements.

10. The electronic device of claim 1, further comprising an encapsulation layer encapsulating the substrate wafer, the encapsulation layer coplanar with the integrated circuit chip.

11. An electronic device, comprising:
    an integrated circuit chip having first contacts;
    a substrate wafer made of a multiplicity of layers and having a top surface with top contact pads and a bottom surface with bottom contact pads;
    wherein said integrated circuit chip is mounted to the substrate wafer with the first contacts connected to the top contact pads; and
    said substrate wafer further including a metal body including: a metal plate embedded between intermediate ones of the multiplicity of layers within the substrate wafer, a first metal region protruding from the metal plate through layers of the substrate wafer to reach the top surface of the substrate wafer and a second metal region protruding from the metal plate through layers of the substrate wafer to reach the bottom surface of the substrate wafer.

12. An electronic device, comprising:
    an integrated circuit chip having first contacts;
    a substrate wafer made of a multiplicity of layers and having a top surface with top contact pads and a bottom surface with bottom contact pads;
    wherein said integrated circuit chip is mounted to the substrate wafer with the first contacts connected to the top contact pads; and
    said substrate wafer further including a metal plate embedded between intermediate ones of the multiplicity of layers within the substrate wafer; wherein the metal plate further comprises a protrusion extending through the multiplicity of layers of the substrate wafer to reach the bottom contact pads of the bottom surface;
    said metal plate including an internal duct filled with a thermally conductive material;
    wherein the metal plate is thermally connected to the integrated circuit chip.

13. The device of claim 12, wherein said substrate wafer further includes a duct extending through the substrate wafer and in fluid communication with the internal duct of the metal plate.

14. The device of claim 13, wherein said duct extending through the substrate wafer is configured for connection to an external means for making a thermally conductive fluid flow through the duct and internal duct.

\* \* \* \* \*